United States Patent
Wilson et al.

(10) Patent No.: US 10,403,390 B1
(45) Date of Patent: Sep. 3, 2019

(54) POST-PACKAGING REPAIR OF REDUNDANT ROWS

(71) Applicant: Micron Technology, Inc., Boise, ID (US)

(72) Inventors: Alan J. Wilson, Boise, ID (US); John E. Riley, McKinney, TX (US)

(73) Assignee: Micron Technology, Inc., Boise, ID (US)

( * ) Notice: Subject to any disclaimer, the term of this patent is extended or adjusted under 35 U.S.C. 154(b) by 9 days.

(21) Appl. No.: 15/948,585

(22) Filed: Apr. 9, 2018

(51) Int. Cl.
| | |
|---|---|
| *G11C 17/00* | (2006.01) |
| *G11C 29/00* | (2006.01) |
| *G11C 17/16* | (2006.01) |
| *G11C 17/18* | (2006.01) |
| *G11C 11/41* | (2006.01) |

(52) U.S. Cl.
CPC .............. *G11C 29/70* (2013.01); *G11C 17/16* (2013.01); *G11C 17/18* (2013.01); *G11C 11/41* (2013.01)

(58) Field of Classification Search
CPC ......... G11C 29/70; G11C 17/16; G11C 17/18; G11C 11/41
See application file for complete search history.

(56) References Cited

U.S. PATENT DOCUMENTS

| | | | | |
|---|---|---|---|---|
| 2009/0303813 | A1* | 12/2009 | Fekih-Romdhane | ........................ G11C 7/1006 365/200 |
| 2015/0135038 | A1 | 5/2015 | Wilson et al. | |
| 2015/0287480 | A1 | 10/2015 | Wilson et al. | |
| 2016/0111171 | A1* | 4/2016 | Yang | ...................... G11C 29/78 365/96 |
| 2016/0307647 | A1* | 10/2016 | Morgan | ................. G11C 29/76 |

* cited by examiner

*Primary Examiner* — Uyen B Tran
(74) *Attorney, Agent, or Firm* — Fletcher Yoder, P.C.

(57) ABSTRACT

Systems and methods to perform post-packaging repair of previously repaired data groups are disclosed. The devices may have an array of addressable rows or columns of memory cells, which can be activated. Upon identification of defect in a memory cell row or column, a repair in which the memory cell may be deactivated and a secondary row may be activated in its place may be performed. Volatile and non-volatile storage elements may be used to store the defective memory addresses. Logic circuitry in the device may match a requested address with the stored addresses and generate logic signals that trigger activation of a repaired row in place of the defective row or column. Moreover, defective rows or columns that have been previously repaired once may be further repaired. To that end, logic circuitry implementing a trumping mechanism may be used to prevent activation of multiple data rows or columns for addresses that were repaired multiple times.

19 Claims, 5 Drawing Sheets

POST-PACKAGING REPAIR OF REDUNDANT ROWS

BACKGROUND

1. Field of the Present Disclosure

This disclosure relates to memory devices, and more particularly, to methods and systems capable of performing post-package repair of memory devices.

2. Description of Related Art

Memory devices, such as random access memory (RAM) devices, dynamic RAM devices (DRAMs), static RAM devices (SRAMs), or flash memories, are often used in electronic systems to provide memory functionality to facilitate data processing operation and/or facilitate data storage that may facilitate data processing operations. To that end, these memory devices may have multiple memory cells that can each store one or more bits of information. The memory cells may be arranged in addressable groups (e.g., rows or columns) within a memory array of a memory bank. When a memory controller receives a request to access a row or column, such as when performing a read or write operation, the memory controller may activate the access to the row and/or column of memory cells.

Due to manufacturing errors and/or failures, certain memory cells may be defective. Quality control testing may be used to identify rows and/or columns containing such defective memory cells. If the number of defective memory cells is small, a pre-packaging re-assignment of memory cells may be used to prevent discarding of otherwise functional devices. In such systems, additional addressable data cells (e.g., redundant rows and/or columns) may be made available during manufacturing and the address associated with a defective row and/or column may be reassigned to a redundant row and/or column. Such reassignment may be hard-wired. For example, the reassignment information may be stored in a non-volatile storage device (e.g., blowing fuses or antifuses disposed within the memory device). Such operation is not easily reversible due to the non-volatility of the storage device.

In the normal course of usage of the memory device, other memory rows and/or columns may fail and present defective cells. In order to increase the lifetime of the memory devices in the presence of these defects, post-packaging repair (PPR) methods may be employed to repair the memory device. Methods and systems to perform PPR may include reassignment of the address associated to a row and/or column. To that end, soft PPR (SPPR) methods may be used to perform this reassignment. In such systems, the information associated with the reassignment may be stored in a volatile memory element (e.g., a latch). As a result, SPPR operations may be reversed or overridden by rewriting the volatile memory element.

BRIEF DESCRIPTION OF THE DRAWINGS

Various aspects of this disclosure may be better understood upon reading the following detailed description and upon reference to the drawings in which.

DETAILED DESCRIPTION

Figure 1:
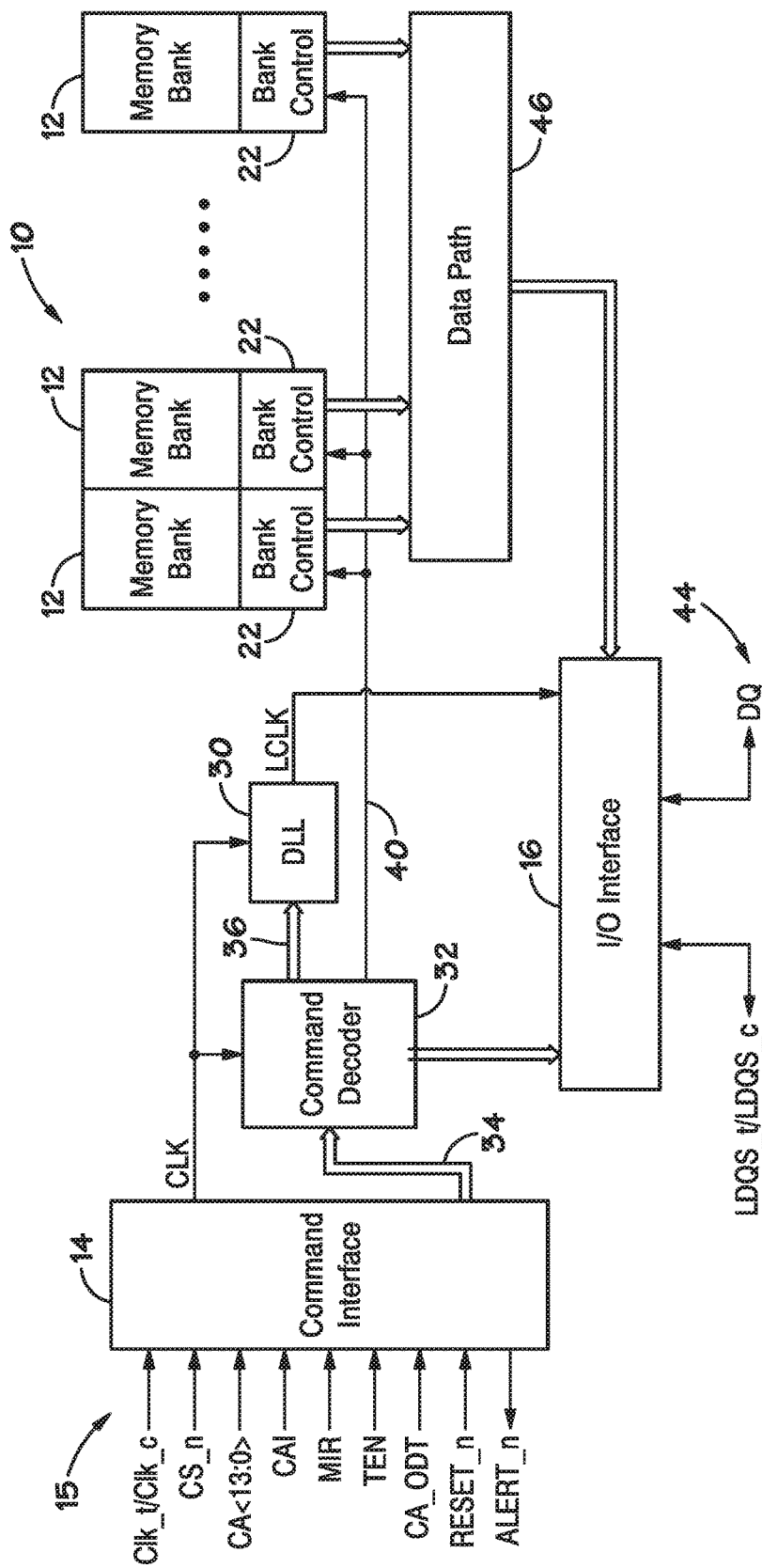
FIG. 1 is a block diagram illustrating an organization of a memory device that may implement post-package repair (PPR) of redundant rows, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Many electronic systems may employ memory devices to provide data storage functionalities and/or facilitate the performance of data processing operations. Several memory devices may perform storage using electronic memory cells, such as capacitors, flip-flops, latches and/or inverter loops, among others. Examples of memory devices include random access memories (RAMs) devices, dynamic RAM (DRAMs) devices, static RAM (SRAMs) devices, and/or flash memories. In such systems, the memory cells may be grouped in memory arrays, which may be addressed in groups (e.g., rows and/or columns). In the present application, the descriptions of the embodiments are related to memory arrays containing memory cells organized in rows (e.g., data rows). It should be understood that the methods and systems described herein may be used in memory devices having memory cells organized in columns.

During certain operations, such as reading and writing operations, a controller in the memory device may receive an address for a memory cell. The memory device controller may determine which memory bank contains the requested memory cell and request access from the corresponding memory bank controller. In turn, the memory bank controller may identify and activate the data row containing the requested memory cell, to perform the requested operation. In certain memory devices, the memory bank may include additional data rows, which may be redundant rows or post-packaging rows (PPR rows), as detailed below. Following manufacturing, defective rows (e.g., data rows containing defective cells) may be identified during pre-packaging tests. If a defective row is identified, the defective row may be deactivated and a redundant row may be used in its place. To that end, a non-volatile memory system may store information such as the assigned address of the defective row, and the address of the redundant row to be used in its place. Such pre-packaging repair is described herein as redundant row repair. Further repair of data rows may take place post-packaging by assigning a defective row to a PPR row. The post-packaging repair (PPR) may be a hard post-packaging repair (HPPR), or soft post-packaging repair (SPPR). HPPR or SPPR may take place by storing the address of a defective row in a memory and rerouting requests from the defective row to a PPR row.

Existing methods for SPPR may be used to perform post-packaging repair on redundant rows by overriding (e.g., trumping) the matched SPPR address stored in a volatile memory with the repaired PPR row address during the data row activation process. However, due to the non-volatile storage used in redundant row repair and in HPPR, methods for HPPR require overriding non-volatile storage and, thus, may introduce substantial delays in the process. Furthermore, methods that perform HPPR without overriding the non-volatile storage may result in unintentional activation of multiple data rows during an operation, which leads to improper function of the memory device. Embodiments described herein are related to systems and methods that may perform HPPR of redundant rows and HPPR-repaired rows by trumping HPPR addresses stored in the non-volatile memory. Accordingly, the methods and systems may be used to perform HPPR without substantial delays.

Turning now to the figures, FIG. 1 is a simplified block diagram illustrating certain features of a memory device 10. Specifically, the block diagram of FIG. 1 is a functional block diagram illustrating a DRAM memory device 10 that may perform PPR in redundant rows. In accordance with one embodiment, the memory device 10 may be a double data rate type five synchronous dynamic random access memory (DDR5 SDRAM) device. Various features of DDR5 SDRAM allow for reduced power consumption, more bandwidth, and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMs). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (GB) DDR5 SDRAM, the memory chip may include 16 memory banks 12, arranged into 8 bank groups, each bank group including 2 memory banks. For a 16 GB DDR5 SDRAM, the memory chip may include 32 memory banks 12, arranged into 8 bank groups, each bank group including 4 memory banks, for instance. Various other configurations, organization, and sizes of the memory banks 12 on the memory device 10 may be utilized depending on the application and design of the overall system.

The memory device 10 may include a command interface 14 and an input/output (I/O) interface 16. The command interface 14 is configured to receive a number of signals (e.g., signals 15) from processing circuitry coupled to the devices, such as a processor or controller. The processor or controller may provide various signals 15 to the memory device 10 to facilitate the transmission and receipt of data to be written to or read from the memory device 10. As an example of signals 15, the processor or controller may request a read and/or write operation by providing the corresponding command and an address via the CA bus.

The command interface 14 may receive one or more clock signals from an external device. Generally, double data rate (DDR) memory utilizes a clock signal referred to herein as a Clk signal, which may be provided as a differential pair formed by the true clock signal (Clk_t) and the complementary clock signal (Clk_c). The positive clock edge for Clk signal in DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

A clock input circuit in the command interface 14 receives the true clock signal (Clk_t) and the complementary clock signal (Clk_c) and generates an internal clock signal CLK. The internal clock signal CLK may be supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands.

Further, the command decoder 32 may decode commands, such as read commands, write commands, mode-register set commands, activate commands, etc., and provide access to a particular memory bank 12 corresponding to the command, via the bus 40. As will be appreciated, the memory device 10 may include various other decoders, such as row decoders and column decoders, to facilitate access to the memory banks 12. In one embodiment, each memory bank 12 includes a bank control circuitry 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address (CA) bus may be a 14-bit bus to accommodate the command/address signals (CA<13:0>). The command/address signals are clocked to the command interface 14 using the clock (Clk_t and Clk_c), as discussed above. Access to specific memory banks 12 within the memory device 10 is encoded on the CA<13:0> bus with the commands. As an example, a processor requesting data from memory device 10 may provide a CS enable signal via an input pin to inform the memory device 10 that it should operate on the CA signal available in the bus. To this end, the command interface 14 and/or the command decoder 32 may receive the CA signal to identify the command and the target memory banks 12 associated with the address in the CA signal. The command decoder 32 may, via the bus 40, request the bank control circuitry 22 associated with the target memory bank 12 to activate a data row or data column associated with the requested address in the CA signal. Based on the command received via bus 40, the bank control block may cause the memory banks 12 to provide the requested data via data path 46 and I/O interface 16 or to store in the memory banks data available in the data path 46, received via I/O interface 16.

In addition, the command interface 14 may be configured to receive a number of other command signals. For instance, a command/address on die termination (CA_ODT) signal may be provided to facilitate proper impedance matching within the memory device 10. A reset command (RESET) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT) to the system processor or controller for certain errors that may be detected. For instance, an alert signal (ALERT) may be transmitted from the memory device 10 if a cyclic redundancy check (CRC) error is detected. Other alert signals may also be generated. Further, the bus and pin for transmitting the alert signal (ALERT) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. To allow for higher data rates within the memory device 10, certain memory devices, such as DDR memory devices, may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t/ and DQS_c) to provide differential pair signaling during reads and writes.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
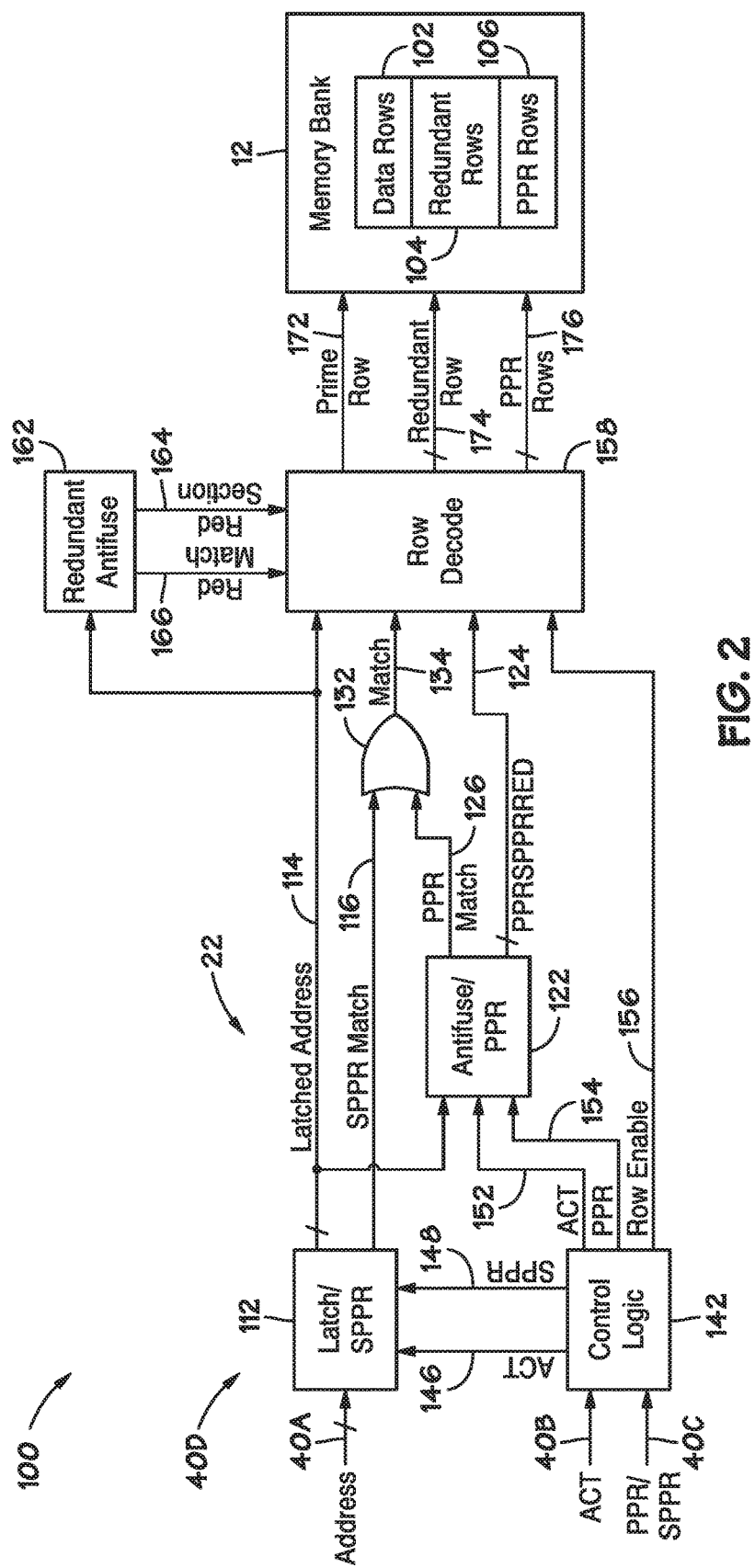
FIG. 2 is a block diagram illustrating memory bank control circuitry that may perform post-package repair (PPR) of redundant rows, in accordance with an embodiment.

FIG. 2 illustrates row selection circuitry 100 that may be disposed in the bank control circuitry 22 that controls a memory bank 12. The memory bank 12 may include an array of memory cells, which may be arranged in rows and/or columns. In the illustrated example, memory cells in memory bank 12 are arranged in data rows 102 (e.g., primary data cells), redundant data rows 104, and PPR data rows 106 (e.g., secondary data cells used for repair). In this memory bank, data rows 102 include the memory cell rows initially assigned for regular operation during production and redundant data rows 104 include additional memory cell rows that may be used during pre-packaging repair, as discussed above (e.g., repair performed by a non-customer). The PPR data rows 106 may be additional memory cell rows available for usage in soft post-packaging repair or hard post-packaging repair (e.g., repair performed by a customer). As detailed below, data rows 102 may be directly addressed by prime row activation lines, redundant data rows 104 may be selected by redundant row selection lines and PPR data rows 106 may be activated by PPR selection lines. In some memory devices, redundant data rows 104 and PPR data rows 106 may be a single group of memory cell rows with a shared address scheme.

Row selection circuitry 100 may receive an address signal 40A, an activation signal 40B, and a SPPR/HPPR signal 40C. Based on the address contained in the address signal 40A, row selection circuitry may activate a corresponding prime data row 102, if that row has not been repaired. If the row has been repaired, either via the redundant row mechanism, performed before packaging, or via the HPPR or the SPPR, performed after packaging (e.g., by the costumer), row selection circuitry 100 may prevent activation of the corresponding defective prime data row 102 and may activate the repaired row (e.g., the redundant data row 104 or the PPR data row 106) reassigned to be used in place of the defective prime data row 102. To perform and/or identify an SPPR repair, the SPPR circuitry 112 may be used. During an SPPR repair operation, SPPR circuitry 112 may store the received address in address signal 40A in a local volatile memory, to perform SPPR. During regular operation (i.e., not during a repair), SPPR circuitry 112 receives and latches the address signal 40A to produce a latched address 114, that may be used by other circuitry in the row selection circuitry 100. Moreover, if the SPPR circuitry 112 determines that the address in the address signal 40A matches the stored address, the SPPR circuitry may provide an SPPR match signal 116 to indicate that the received address signal 40A corresponds to a row repaired via SPPR.

To perform and/or identify HPPR repair, HPPR circuitry 122 may be used. During an HPPR repair operation, the HPPR circuitry 122 may store the latched address 114 in a local non-volatile memory, which may be write-once internal memory devices (e.g., antifuse banks). In some embodiments, each non-volatile memory cell may be associated with a PPR data row 106. During regular operation (i.e., not during a repair), HPPR circuitry 122 may compare the latched address 114 with the address stored in the antifuse banks and, if a match appears, provide a corresponding PPR row address 124 and a HPPR match signal 126. A logic element 132 (e.g., OR gate) may combine SPPR match signal 116 and HPPR match signal 126 to produce a match signal 134. During regular operation, match signal 134 indicates that the address signal 40A contains an address that was repaired via HPPR and/or SPPR.

Controller logic 142 in the row selection circuitry 100 may be used to manage the operation of SPPR circuitry 112 and HPPR circuitry 122. Controller logic 142 may receive, via SPPR/HPPR signal 40C, instructions to indicate that the costumer is requesting a post-packaging repair (e.g., a HPPR or an SPPR). In some embodiments, the SPPR/HPPR signal 40C may be an instruction that specifies the mode of post-packaging repair. In some embodiments, the SPPR/HPPR signal 40C may be an instruction requesting a repair to be performed without specifying a specific mode of post-packaging repair. Controller logic may also receive the ACT signal 40B, that may include an activation trigger (e.g., an activating edge) that synchronizes the operations associated with data row activation and/or data row repair. When controller logic 142 requests an SPPR, controller logic 142 may send an ACT signal 146 and an SPPR signal 148 to the SPPR circuitry 112. When controller logic 142 requests an HPPR, it may send an ACT signal 152 and an HPPR signal 154 to the HPPR circuitry 122.

Controller logic 142 may also provide an activating row enable signal 156 to a row decoder 158 to trigger an activation of memory cell rows. Row decoder 158 may receive the latched address 114, the PPR row address 124, the match signal 134 and the row enable signal 156, described above. Row decode may be further coupled to redundant repair circuitry 162, that may store address repaired pre-packaging. Redundant repair circuitry 162 may compare a received latched address 114 with internal non-volatile memory cells (e.g., antifuse banks). If a match is identified (i.e., latched address 114 is associated with a redundant data row 104), redundant repair circuitry 162 may provide the redundant row address 164 associated with the latched address 114, and assert the redundant match signal 166. In some embodiments, redundant repair circuitry 162 and HPPR circuitry 122 functionalities may be provided by a single repair circuitry that includes non-volatile memory storing repaired addresses matched to redundant data rows 104 and/or PPR data rows 106.

Row decoder 158, detailed below, may receive the latched address 114, repair match information (e.g., match signal 134 and redundant match signal 166), repair address (e.g., PPR row address 124 and redundant row address 164), and a triggering row enable signal 156, and activate specific data rows. If the latched address corresponds to a prime data row 102 that has not been repaired, row decoder 158 may activate the prime row (i.e., the prime data row 102 assigned during manufacturing) via prime row signal 172. If the latched address corresponds to a pre-packaging repaired row, row decoder 158 may activate the associated redundant row using the redundant row address bus 174. If the latched address corresponds to a post-packaging repaired row, row decoder 158 may activate the associated PPR row using the PPR row address bus 176. Row selection circuitry 100 implements an overriding or trumping mechanism for operation, in which HPPR and SPPR repaired rows take precedence over redundant rows. Such a mechanism obviates the requirement for overriding redundant row repairs in the process of performing HPPRs and/or SPPRs, as the non-volatile memory in redundant repair circuitry 162 does not need to be modified.

Figure 3:
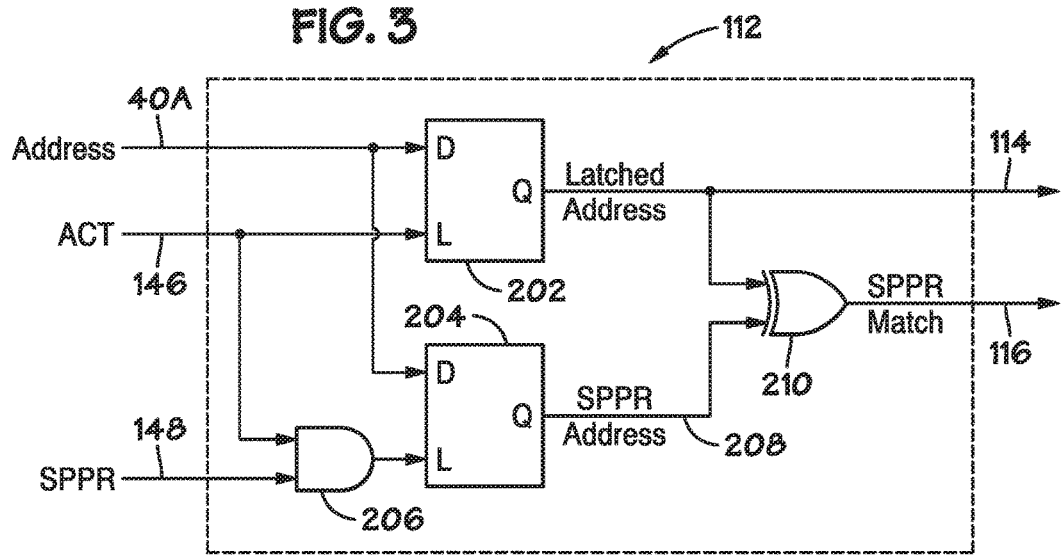
FIG. 3 is a block diagram illustrating a soft PPR (SPPR) latch circuitry that may be used by memory bank control circuitry such that of FIG. 2, in accordance with an embodiment.
Figure 4:
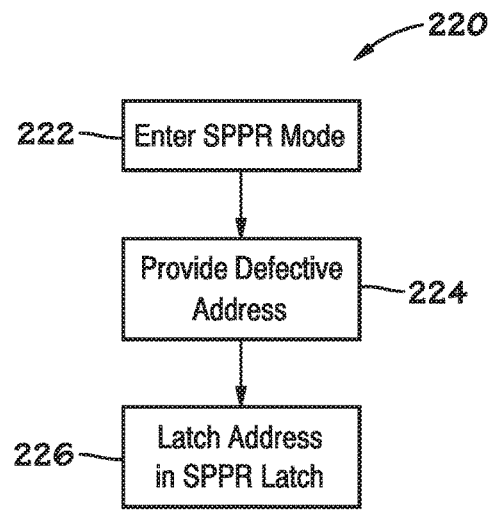
FIG. 4 is a method to perform SPPR, in accordance with an embodiment.

FIG. 3 illustrates SPPR circuitry 112, and FIG. 4 illustrates a method 220 for performing SPPR using the SPPR circuitry 112. As discussed above, SPPR circuitry may receive an address signal 40A and a triggering ACT signal 146. A latch 202 may store the address in the address signal 40A, as triggered using the ACT signal 146, to provide latched address 114. An SPPR latch 204 may be used to store an address to perform an SPPR, as triggered by the SPPR signal 148. By asserting the SPPR signal 148, the SPPR circuitry may enter an SPPR mode (e.g., block 222 of method 220). The address to be repaired may be provided via address signal 40A (e.g., block 224 of method 220). The logic element 206 (e.g., an AND gate) may combine the triggering ACT signal 146 and the asserted SPPR signal to make the SPPR latch 204 transparent. In the transparent state, SPPR latch 204 may store the address to be repaired (e.g., block 226 of method 220). Once the SPPR signal 148 is deasserted, SPPR latch 204 may store the repaired address. During regular operation, the SPPR latch 204 is not transparent, and may provide the SPPR address stored 208. A logic element 210 (e.g., XOR gate) may compare the stored SPPR address with the latched address 114. If the address matches (e.g., all bits of the latched address 114 are the same as the bits of the SPPR address 208), the SPPR match signal 116 may be asserted.

Figure 5:
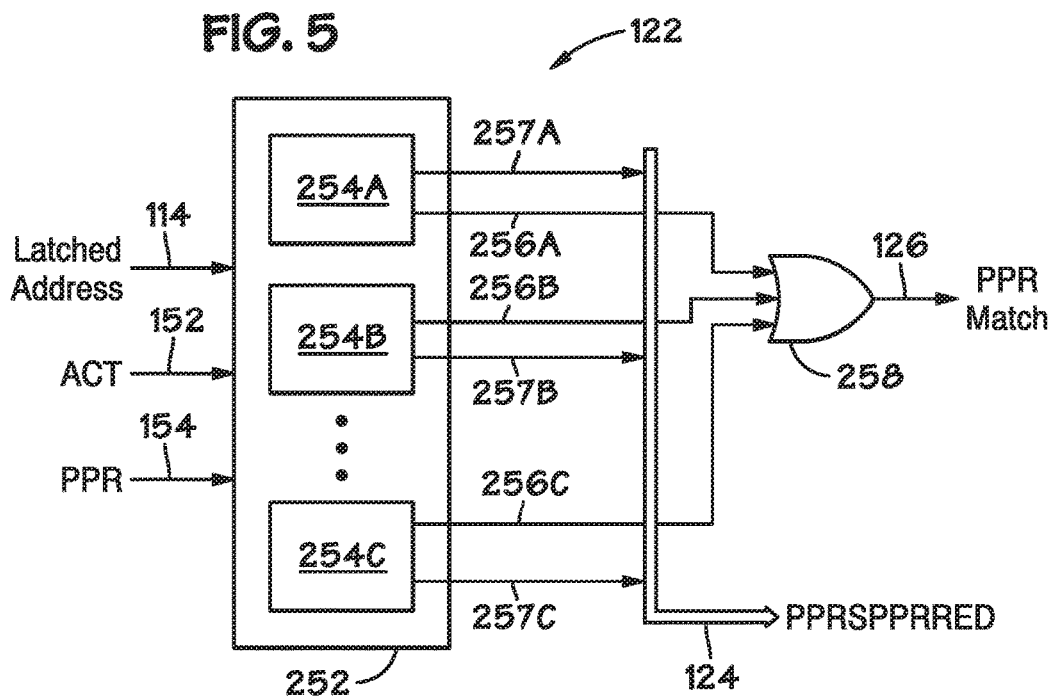
FIG. 5 is a block diagram illustrating hard PPR (HPPR) storage circuitry, that may be used by memory bank control circuitry such as that of FIG. 2, in accordance with an embodiment.
Figure 6:
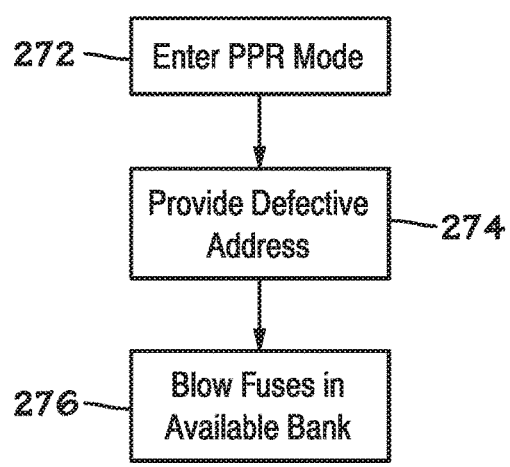
FIG. 6 is a method to perform HPPR, in accordance with an embodiment.

FIG. 5 illustrates HPPR circuitry 122, and FIG. 6 illustrates a method 270 for performing HPPR using the HPPR circuitry 122. In the illustrated HPPR circuitry 122, the non-volatile storage 252 may have antifuse banks, such as the illustrated antifuse banks 254A, 254B, and 254C. Each antifuse bank 254 may be a write-once memory device. To enter the HPPR operation (e.g., block 272 of method 270), the HPPR circuitry 122 may receive an HPPR signal 154 and a triggering ACT signal 152. The HPPR circuitry 122 may also receive the latched address 114 to be repaired (block 274 of method 270). Upon receiving the ACT signal 152, the HPPR circuitry 122 may blow fuses of the antifuse banks 252 to store the defective latched address 114 (block 276 of method 270).

During regular operation each antifuse bank 252 may receive the latched address 114 and compare it with the stored address. For example, antifuse bank 254A may compare the latched address 114 with the address latched in antifuse bank 254A. If a match occurs, the antifuse bank 254A may assert a match signal 256A. Similarly, antifuse bank 254B may assert a match signal 256B, antifuse bank 254C may assert a match signal 256C, etc. A logic element 258 (e.g., OR gate) may combine the match signals 256A, 256B, 256C, etc., to form a single HPPR match signal 126, described above. In some embodiments, each antifuse bank may be associated with a PPR row. In such embodiment, if a match occurs, the antifuse bank 254A may provide an address 257A to the PPR row bus 124. Similarly, antifuse bank 254B may provide an address 257B and antifuse bank 254C may provide an address 257C to the PPR row bus 124. It should be noted that the addresses 257A, 257B, and 257C are addresses associated with PPR data rows 106 and may be distinct from the latched address 114 or the addresses stored in the antifuse banks 254.

Figure 7:
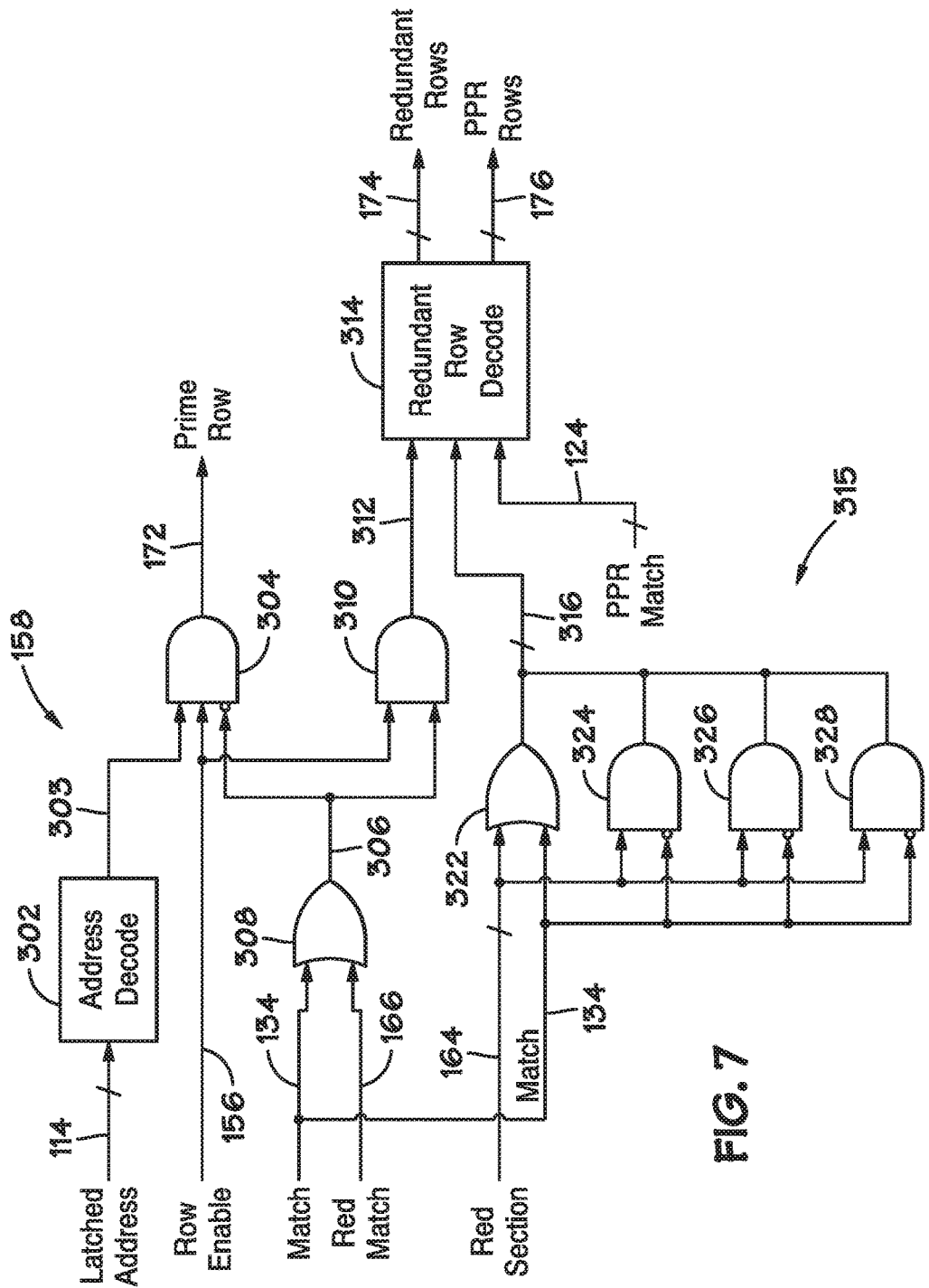
FIG. 7 is a block diagram illustrating row decoder circuitry that can implement PPR for redundant rows, in accordance with an embodiment.

FIG. 7 illustrates a row decoder 158 that may implement the overriding (e.g., trumping) mechanism that allows repair of redundant rows without overriding the non-volatile storage in redundant repair circuitry 162. The row decoder 158 may have address decoder circuitry 302 that can be used for activation of non-repaired data rows 102. The address decoder circuitry 302 may receive the latched address 114 and produce a row activation signal 303 associated with a corresponding prime data row 102. A logic element 304 (e.g., an AND gate) may gate the row activation signal 303 and produce a prime row signal 172 based on a row enable signal 156. Logic element 304 may also use a repair match signal 306 for gating the row activation signal 303. Repair match signal 306 may be produced by a logic element 308 (e.g., an OR gate) that receives match signal 134 and redundant match signal 166. As discussed above, match signal 134 may be asserted if the requested address (e.g., latched address 114) was repaired via HPPR and/or SPPR, and redundant match signal 166 may be asserted if the requested address was repaired pre-packaging via the redundant row mechanism. The operation of logic elements 304 and 308 allow preventing the activation of a non-repaired data row when a row was repaired.

The repair match signal 306 along with the row enable signal 156 are provided to a logic element 310 (e.g., an AND gate) that produces a gated repair matched signal 312. The gated repair matched signal 312 may be provided for a redundant row decoder circuitry 314, which identifies and activates a single repaired row (e.g., a redundant data row 104 and/or a PPR data row 106). To that end, the gated repair matched signal 312 may be asserted when the latched address 114 corresponds to a repaired address. Redundant row decoder circuitry 314 may be used to activate a data row that was repaired pre-packaging (e.g., a redundant data row 104), through redundant row address bus 174. Redundant row decoder circuitry 314 may also be used to activate a data row that repaired via HPPR and/or via SPPR, through PPR row address bus 176.

Address selection circuitry 315 may be used to select between the activation of a redundant data row 104 or of a PPR data row 106. In the illustrated example, the address selection circuitry 315 receives a redundant row address 164 and a match signal 134 that, when asserted, indicates that a PPR repair was performed. When the match signal 134 is not asserted, the address selection circuitry 315 may produce the redundant row address 164 as the repaired row address 316. When the match signal 134 is asserted, the address selection circuitry 315 may produce a fixed address to repaired row address 316. In the illustrated examples, the logic elements 322, 324, 326, and 328 are arranged such that when the match signal is asserted, and assuming that logic element 322 produces the lowest order bit, the repaired row address 316 becomes the binary address 0001, which may correspond to a default SPPR address. Redundant row decoder circuitry 314 may receive the repaired row address 316. It should be noted that if either an HPPR or an SPPR is performed on a row repaired pre-packaging (e.g., match signal 134 is asserted), the address selection circuitry 315 may be used to trump the redundant row address 164.

Redundant row decoder circuitry 314 may receive the repaired row address 316. Redundant row decoder circuitry 314 may also receive a PPR row address 124 that indicates the PPR data row 106 address used to perform the HPPR, as discussed with respect to FIG. 5 above. In the illustrated example, thus, the redundant row decoder circuitry 314 may process the inputs received (e.g., repair matches signal 312, repaired row address 316 and/or PPR row address 124) to activate a specific data row, when there is a repair associated with the latched address 114. For example, the redundant row decoder 314 may activate a redundant data row 104 using the redundant row address bus 174 or activate a PPR data row 106 using the PPR row address bus 176. It should be noted that, generally, only a single data row is activated to prevent malfunctioning of the memory devices due to data collision.

In some embodiments, the redundant data row 104 and the PPR data row 106 may be a section that shares an address space. In such example, a single address bus may be used in place of the illustrated pair of address busses, redundant row address bus 174, and PPR row address bus 176. Moreover, it should be understood that the selection between the addresses (e.g., between the redundant repair address, the SPPR default address, or the HPPR address) may take place in the address selection circuitry 315. In such an example, address selection circuitry 315 may receive the redundant row address 164 and the PPR row address 124, and select between producing the redundant row address, the PPR row address or a default SPPR address (e.g., 0001) based on received matching signals (e.g., SPPR match signal 116 and HPPR match signal 126, redundant match signal 166) to implement the overriding mechanism.

Embodiments described herein may be used to allow memory devices to perform post-packaging repair (e.g., SPPR and HPPR) to data rows repaired using redundant rows (e.g., pre-packaging repair). To that end, the embodiment may include logic circuitry that implements an overriding (e.g., trumping) mechanism that establishes a precedence between the modes of repair, and activate data rows accordingly. For example, if an SPPR match occurs, the SPPR data row, which may be a default SPPR data row, is activated. In this example, if an HPPR match occurs and no SPPR match occurs, the corresponding PPR data row is activated. Furthermore, if a redundant row match occurs and no HPPR or SPPR match occurs, the corresponding data row may be activated. If no match occurs (e.g., no repair was performed), the prime row may be activated.

The architecture for the logic described above provides flexibility of repairs in data rows that would not be otherwise available for repair (e.g., pre-packaging repairs), without performing lengthy unrepair processes via modification of non-volatile memory. This modification may also allow the client to interact with SPPR and HPPR using a common interface, as they become functionally similar and are both able to repair data rows that had been previously repaired. Moreover, the overriding/trumping architecture described above may be implemented in some SPPR designs with simple modifications to the control logic and addressing bus.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A memory device, comprising:
   a memory bank comprising a plurality of addressable groups of memory cells, wherein the plurality of addressable groups of memory cells comprises a primary set of addressable groups and a secondary set of addressable groups; and
   control circuitry configured to activate an addressable group of the memory bank, the control circuitry comprising:
      first repair circuitry comprising a first non-volatile memory configured to store a first set of addresses corresponding to a first defective addressable group repaired in a first mode;
      second repair circuitry comprising a second non-volatile memory configured to store a second set of addresses corresponding to a second defective addressable group repaired in a second mode;
      third repair circuitry comprising a volatile memory configured to store an address corresponding to a third defective addressable group repaired in a soft post-packaging repair, wherein the logic circuitry is configured to compare the received address with the address stored in the volatile memory; and logic circuitry configured to compare a received address with addresses stored in the first non-volatile memory or the second non-volatile memory and activate a single addressable group of memory cells, wherein the logic circuitry is configured to activate:

a first addressable group of the primary set of addressable groups when the received address is not in the first non-volatile memory nor in the second non-volatile memory;

a second addressable group of the secondary set of addressable groups when the received address is stored in the first non-volatile memory and not stored in the second non-volatile memory; and a third addressable group of the secondary set of addressable groups when the received address is stored in the second non-volatile memory.

2. The memory device of claim 1, wherein each addressable group of memory cells comprises a respective addressable row of memory cells.

3. The memory device of claim 1, wherein the secondary set of addressable groups comprises:

a set of redundant groups that comprises the second addressable group; and a set of post-packaging repair groups that comprises the third addressable group.

4. The memory device of claim 1, wherein the first mode comprises a redundant row repair and the second mode comprises a hard post-packaging repair.

5. The memory device of claim 1, wherein the second non-volatile memory comprises an antifuse bank.

6. The memory device of claim 1, wherein the logic circuitry is configured to activate:

the first addressable group of the primary set of addressable groups when the received address is not stored in the first non-volatile memory, stored in the second non-volatile memory, or stored in the volatile memory;

the second addressable group of the secondary set of addressable groups when the received address is stored in the first non-volatile memory and not stored in the second non-volatile memory or stored in the volatile memory;

the third addressable group of the secondary set of addressable groups when the received address is stored in the second volatile memory and not stored in the volatile memory; and a soft post-packaging repair addressable group of the secondary set of addressable groups when the received address is stored in the volatile memory.

7. The memory device of claim 1, wherein the logic circuitry is configured to enter a soft post-packaging repair (SPPR) mode upon receiving an SPPR instruction and store the received address in the volatile memory.

8. The memory device of claim 1, wherein the logic circuitry is configured to enter a hard post-packaging repair (HPPR) mode upon receiving an HPPR instruction and store the received address in the second non-volatile memory.

9. The memory device of claim 1, wherein the logic circuitry comprises row decoder circuitry configured to receive a first address for the second addressable group from the first repair circuitry and a second address for the third addressable group from the second repair circuitry, and wherein the row decoder circuitry activates the addressable group based on the first address or the second address.

10. A memory bank controller comprising:

address decoding circuitry configured to receive an address and to generate a prime row signal corresponding to a prime data group of a memory bank associated with the received address;

redundant repair circuitry comprising first non-volatile memory configured to generate a redundant repair signal corresponding to a first repair data group when the first non-volatile memory comprises the received address;

hard post-packaging repair (HPPR) circuitry comprising second non-volatile memory configured generate a HPPR signal corresponding to a second repair data group when the second non-volatile memory comprises the received address;

soft post-packaging repair (SPPR) circuitry comprising volatile memory configured to generate a SPPR signal corresponding to a third repair data group when the volatile memory comprises the received address; and logic circuitry configured to activate the prime data group, the first repair data group, the second repair data group, or the third repair data group.

11. The memory bank controller of claim 10, wherein the logic circuitry is configured to activate:

the third repair data group when the volatile memory comprises the received address;

the second repair data group when the second non-volatile memory comprises the received address and the volatile memory does not comprise the received address;

the first repair data group when the first non-volatile memory comprises the received address and the second non-volatile memory and the volatile memory does not comprise the received address; and the prime data group when the first non-volatile memory, the second non-volatile memory, and the volatile memory do not comprise the received address.

12. The memory bank controller of claim 10, wherein the second non-volatile memory comprises an antifuse bank.

13. The memory bank controller of claim 12, wherein the HPPR circuitry is configured to:

enter a HPPR mode upon receiving an activation signal; and store a defective group address by blowing antifuses of the antifuse bank in the HPPR mode.

14. The memory bank controller of claim 10, wherein the volatile memory comprises a latch.

15. The memory bank controller of claim 10, wherein the SPPR circuitry is configured to:

make the latch transparent to enter a SPPR mode upon receiving an activation signal; and store a defective group address in the latch.

16. A method to operate a memory device that comprises a memory bank that comprises a memory array comprising addressable data groups, the method comprising:

receiving an address for a first data row;

decoding the received address to generate a signal that activates a prime addressable data group associated with the received address;

generating a plurality of matching signals if the received address is a repaired address by comparing the received address with a stored address in a memory of a memory bank controller, wherein each matching signal is associated with a mode of repair; and activating an addressable data group based on the plurality of matching signals, wherein generating the plurality of matching signals comprises:

asserting a first matching signal in a soft post-packaging repair (SPPR) circuitry when the received address is stored in a volatile memory of a memory bank controller;

asserting a second matching signal in a hard post-packaging repair (HPPR) circuitry when the received address is stored in a first non-volatile memory of the memory bank controller; and asserting a third matching signal in a redundant repair circuitry when the received address is stored in a second non-volatile memory of the memory bank controller.

17. The method of claim 16, wherein activating an addressable data group comprises:

activating a first addressable data group when the first matching signal is asserted;

activating a second addressable data group when the second matching signal is asserted and the first matching signal is not asserted;

activating a third addressable data group when the third matching signal is asserted and the first and second matching signals are not asserted; and activating the prime addressable data group when the first, the second, and the third matching signals are not asserted.

18. The method of claim 16, comprising:

receiving an instruction to perform an SPPR; and storing a received repair address in the volatile memory.

19. The method of claim 16, comprising:

receiving an instruction to perform an HPPR; and storing a received repair address in the first non-volatile memory.

\* \* \* \* \*